United States Patent
Kim et al.

(10) Patent No.: US 7,919,365 B2
(45) Date of Patent: Apr. 5, 2011

(54) FABRICATION METHODS OF A ZNO THIN FILM STRUCTURE AND A ZNO THIN FILM TRANSISTOR, AND A ZNO THIN FILM STRUCTURE AND A ZNO THIN FILM TRANSISTOR

(75) Inventors: Chang-Jung Kim, Yongin-si (KR);
I-Hun Song, Seongnam-si (KR);
Dong-Hun Kang, Yongin-si (KR);
Young-Soo Park, Suwon-si (KR);
Eun-Ha Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/702,211

(22) Filed: Feb. 5, 2007

(65) Prior Publication Data
US 2007/0241327 A1  Oct. 18, 2007

(30) Foreign Application Priority Data
Apr. 18, 2006  (KR) .................. 10-2006-0035076

(51) Int. Cl.
*H01L 21/00* (2006.01)

(52) U.S. Cl. .......... 438/149; 438/104; 257/43; 257/613; 257/614; 257/E29.273; 257/E29.296

(58) Field of Classification Search .................. 257/43, 257/613, E21.372, E29.273, E27.06, E29.169, 257/E29.242, E21.051, E21.4, 614, E29.296; 438/104, 149
See application file for complete search history.

(56) References Cited

U.S. PATENT DOCUMENTS
2003/0218222 A1 * 11/2003 Wager et al. ................. 257/410
2005/0275038 A1 * 12/2005 Shih et al. .................... 257/382
2006/0220023 A1 * 10/2006 Hoffman et al. .............. 257/72
* cited by examiner

*Primary Examiner* — Kenneth A Parker
*Assistant Examiner* — Jay C Kim
(74) *Attorney, Agent, or Firm* — Harness, Dickey & Pierce, PLC

(57) ABSTRACT

Provided is a method of fabricating a ZnO thin film structure and a ZnO thin film transistor (TFT), and a ZnO thin film structure and a ZnO thin film transistor. The method of fabricating a ZnO thin film structure may include forming a ZnO thin film on a substrate in an oxygen atmosphere, forming oxygen diffusion layers of a metal having an affinity for oxygen on the ZnO thin film and heating the ZnO thin film and the oxygen diffusion layers to diffuse oxygen of the ZnO thin film into the oxygen diffusion layers.

7 Claims, 13 Drawing Sheets

ZnO DEPOSITION

DIFFUSION LAYER FORMATION

OXYGEN DIFFUSION

DIFFUSION LAYER FORMATION

ZnO DEPOSITION

OXYGEN DIFFUSION

FABRICATION METHODS OF A ZNO THIN FILM STRUCTURE AND A ZNO THIN FILM TRANSISTOR, AND A ZNO THIN FILM STRUCTURE AND A ZNO THIN FILM TRANSISTOR

PRIORITY STATEMENT

This application claims priority under 35 USC §119 to Korean Patent Application No. 10-2006-0035076, filed on Apr. 18, 2006, in the Korean Intellectual Property Office (KIPO), the entire contents of which are incorporated herein by reference.

BACKGROUND

1. Field

Example embodiments relate to methods of fabricating a ZnO thin film structure and a ZnO thin film transistor (TFT), and a ZnO thin film structure and a ZnO TFT.

2. Description of the Related Art

Zinc oxide (ZnO) as a metal oxide semiconductor may be applied to TFTs, sensors, optical wave guides and/or piezoelectric elements. In general, a ZnO thin film grown at a higher temperature of about 400° C. or more may have higher quality. However, such higher temperature growth limits the materials that may be used to form a substrate and thus may not be applied to a plastic substrate which may be susceptible to heat damage.

In the related art, a substrate may be heated at a temperature between about 350° C. and about 450° C. during growth of ZnO, and a ZnO crystal may be grown at a temperature between about 600° C. and about 900° C. In a general ZnO TFT, a channel may be formed of ZnO; a source, a drain, and a gate may be formed of metals (e.g., Mo); and a gate insulator may be formed of SiNx and/or $SiO_2$. The ZnO TFT may be covered with a protection layer and/or a passivation layer formed of $SiO_2$ and/or SiNx so as to be insulated and protected from other elements formed on the ZnO TFT.

A ZnO thin film may be formed in an oxygen atmosphere by metal organic chemical vapor deposition (MOCVD) and/or sputtering. Semiconductor characteristics of a ZnO thin film may be sensitive to the amount of oxygen content, and thus the content of oxygen may be adjusted. In general, an oxygen partial pressure may be appropriately adjusted with respect to an atmosphere gas to adjust the content of oxygen during depositing of ZnO. However, this method may be relatively difficult and thus may not be successful. It may be difficult to more easily obtain desired semiconductor characteristics of ZnO through the adjustment of the oxygen partial pressure. As a result, dopants must be added to ZnO to obtain desired semiconductor characteristics.

SUMMARY

Example embodiments provide methods of fabricating a ZnO thin film structure and a ZnO thin film transistor (TFT) through an adjustment of the content of oxygen, and a ZnO thin film structure and a ZnO TFT.

According to example embodiments, a method of fabricating a zinc oxide (ZnO) thin film structure may include forming a ZnO thin film on a substrate in an oxygen atmosphere, forming oxygen diffusion layers on the ZnO thin film using a metal having an affinity for oxygen and heating the ZnO thin film and the oxygen diffusion layers to diffuse oxygen of the ZnO thin film into the oxygen diffusion layers.

According to other example embodiments, a method of fabricating a ZnO TFT may include forming a semiconductor channel including a ZnO thin film in an oxygen atmosphere, forming source and drain electrodes including conductive oxygen diffusion layers contacting opposite sides of the semiconductor channel and heating the semiconductor channel and the source and drain electrodes to diffuse oxygen of the semiconductor channel into the conductive oxygen diffusion layers to adjust a density of oxygen of the semiconductor channel.

The conductive oxygen diffusion layers may be formed after the ZnO thin film is formed or before the ZnO thin film is formed. The ZnO thin film may be formed using an RF magnetron sputtering method. The conductive oxygen diffusion layers may be formed of Ti, Ta, Ni and/or ITO.

According to example embodiments, a zinc oxide (ZnO) thin film structure may include a ZnO thin film on a substrate and oxygen diffusion layers on the ZnO thin film, the oxygen diffusion layers including a metal having an affinity for oxygen. The ZnO thin film may be formed using a radio frequency (RF) magnetron sputtering method. The oxygen diffusion layers may be made of one of Ti, Ta, Ni, and ITO.

According to other example embodiments, a ZnO TFT (thin film transistor) may include a semiconductor channel including a ZnO thin film, source and drain electrodes including conductive oxygen diffusion layers formed of a metal having an affinity for oxygen and contacting opposite sides of the semiconductor channel, a gate forming an electrical field in the channel and a gate insulator between the gate and the semiconductor channel.

The conductive oxygen diffusion layers may be formed of Ti, Ta, Ni and/or ITO. The source and drain electrodes may include first layers contacting the semiconductor channel and second layers stacked on the first layers. The first layers may be the conductive oxygen diffusion layers. The second layers may be formed of Pt. The gate may be between the semiconductor channel and the substrate. The gate may be on the semiconductor channel.

BRIEF DESCRIPTION OF THE DRAWINGS

Example embodiments will be more clearly understood from the following detailed description taken in conjunction with the accompanying drawings. FIGS. 1A-9C represent non-limiting, example embodiments as described herein.

FIGS. 1A-1C are diagrams illustrating a method of fabricating a ZnO thin film structure according to example embodiments;

FIG. 3 is a diagram of a top gate type ZnO TFT according to example embodiments;

FIG. 4 is a diagram of a bottom gate type ZnO TFT according to example embodiments;

FIG. 7 is a transmission electron microscopy (TEM) image of a sample including a Ti diffusion layer and a Pt electrode formed on a ZnO thin film;

FIGS. 9A-9C are graphs illustrating oxygen diffusion layers of a ZnO TFT before and after the ZnO TFT is heated.

DETAILED DESCRIPTION OF EXAMPLE EMBODIMENTS

Figure 1A:
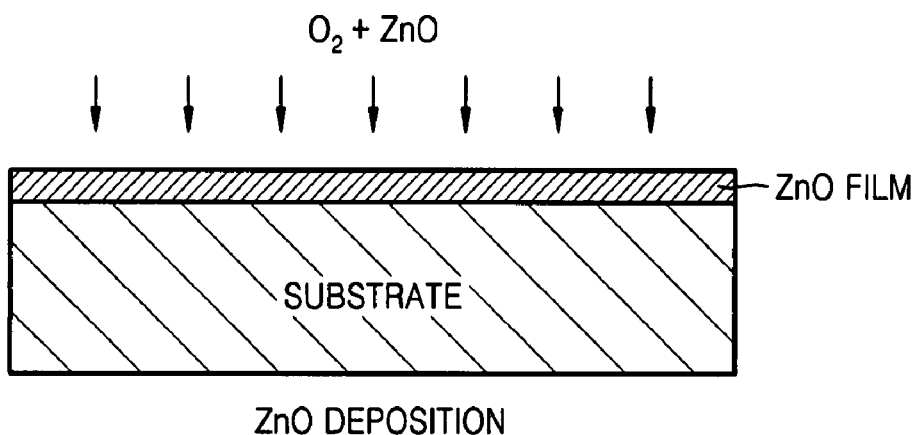

Hereinafter, methods of fabricating a ZnO thin film structure and a ZnO TFT, and a ZnO thin film structure and a ZnO TFT according to example embodiments will be described in detail with reference to the attached drawings. Example embodiments may, however, be embodied in many different forms and should not be construed as limited to the example embodiments set forth herein. Rather, these embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In example embodiments, a ZnO TFT may be fabricated using a relatively low temperature process of about 350° C. or less, and a ZnO thin film may be formed using sputtering, for example, radio frequency (RF) magnetron sputtering.

Figure 1B:
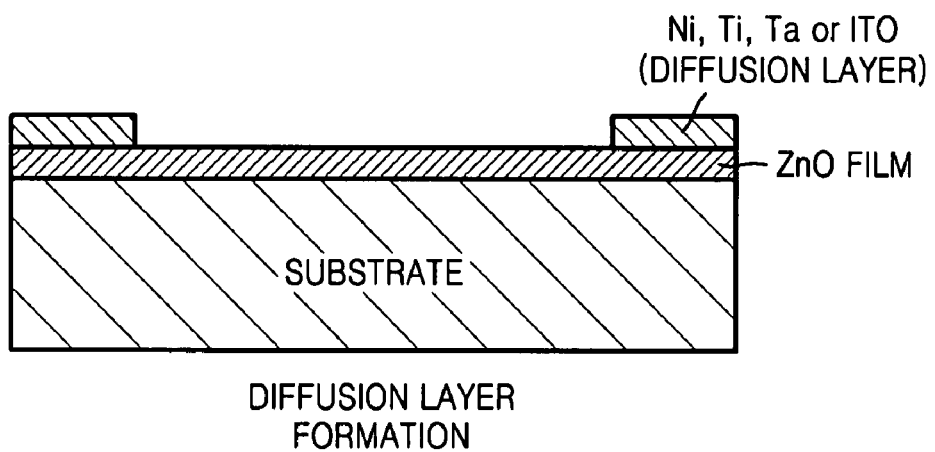
Figure 1C:
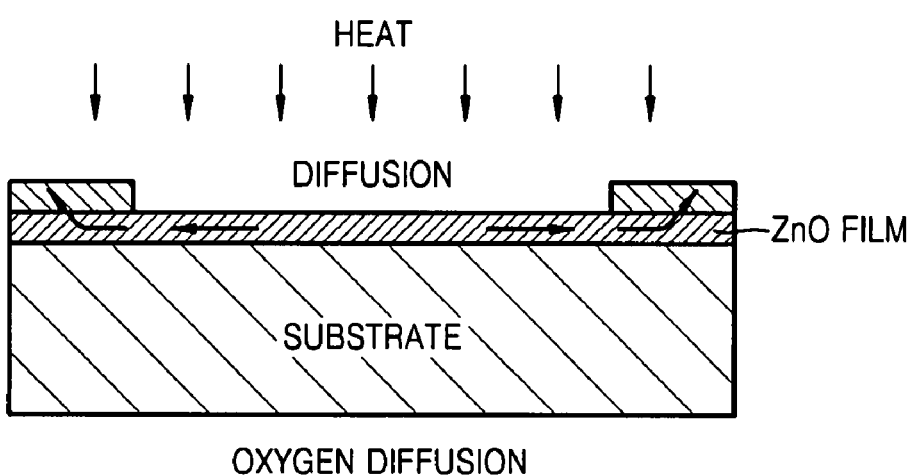

FIGS. 1A-1C are diagrams illustrating a method of fabricating a ZnO thin film structure according to example embodiments. As shown in FIGS. 1A-1C, to fabricate a ZnO thin film structure according to example embodiments, a ZnO thin film may be deposited on a substrate in an oxygen atmosphere using a pure ZnO target not including dopant. A diffusion layer may be formed on the upper surface of the ZnO thin film. The diffusion layer may be formed of a metal having an affinity for oxygen (e.g., Ti, Ni, Ta and/or ITO). Thereafter, oxygen of the ZnO thin film may be diffused into the diffusion layer by heating which lowers the density of oxygen of the ZnO thin film, and thus the ZnO thin film may have semiconductor properties. The diffusion of oxygen into the diffusion layer, e.g., the oxidization of the diffusion layer, may be controlled by adjusting the temperature and the duration of the heating treatment. The density of oxygen in the ZnO thin film may be adjusted by diffusion and maintained within an acceptable range to realize semiconductor characteristics.

Figure 2A:
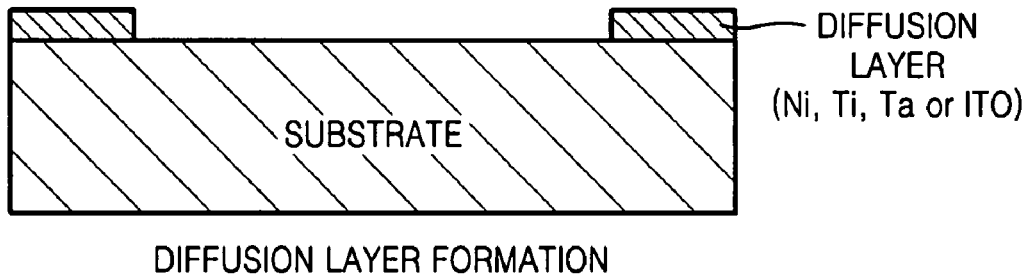
FIGS. 2A-2C are diagrams illustrating a method of a fabricating a ZnO thin film structure according to example embodiments.
Figure 2B:
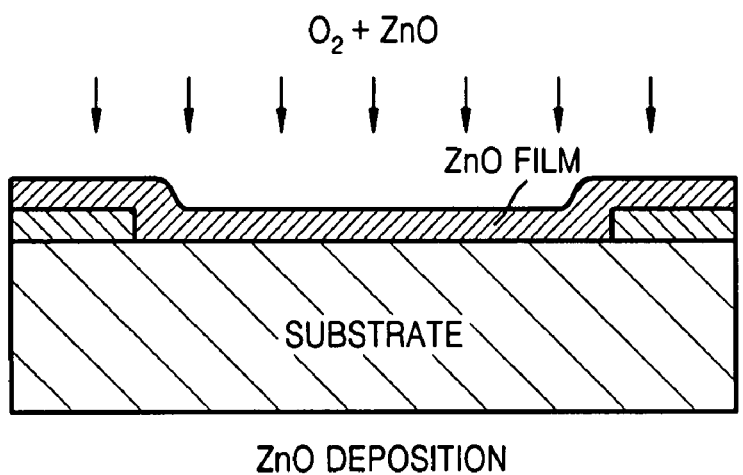
Figure 2C:
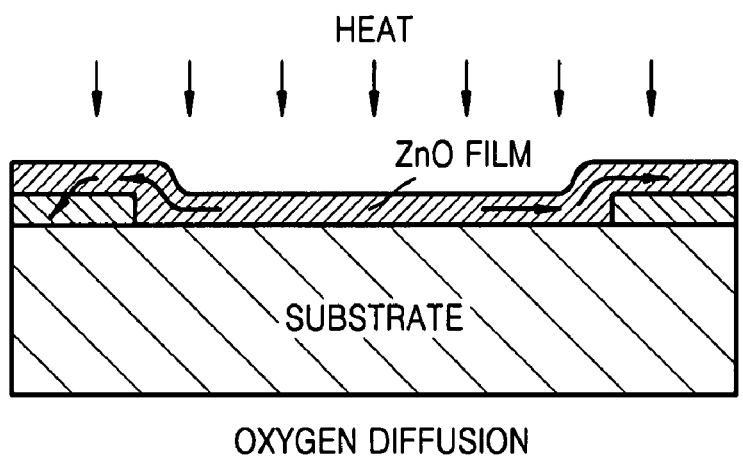

FIGS. 2A-2C are diagrams illustrating a method of fabricating a ZnO thin film structure according to example embodiments. Diffusion layers may be formed on a substrate before a ZnO thin film is formed. The diffusion layers may be formed of a material having an affinity for oxygen (e.g., Ti, Ta, Ni and/or ITO) on sides and/or a whole upper surface of the substrate by general deposition and/or patterning. A ZnO thin film may be formed on the substrate to cover the diffusion layers. The ZnO thin film may be formed in an oxygen atmosphere by sputtering using a pure ZnO target not including dopant. A heating process may be performed to diffuse oxygen of the ZnO thin film into the diffusion layers which lowers the density of oxygen in the ZnO thin film, and thus the ZnO thin film may have semiconductor characteristics as described above. The diffusion of oxygen into the diffusion layers, e.g., the oxidization of the diffusion layers, may be controlled by adjusting the temperature and the duration of the heating process. The density of oxygen in the ZnO thin film may be adjusted by the diffusion and maintained within an acceptable range to realize semiconductor characteristics. One and/or more diffusion layers may be formed.

In example embodiments, a ZnO thin film having a density within a predetermined or given range may be formed using an existing method. Oxygen of the ZnO thin film may be removed using a material layer reacting with oxygen as a diffusion layer to adjust the density of oxygen in the ZnO thin film so that the ZnO thin film becomes a semiconductor material. A ZnO TFT according to example embodiments may be fabricated using a method of fabricating a ZnO thin film structure. The method of fabricating the ZnO thin film structure may be further understood in the later description of a method of fabricating a ZnO TFT.

Figure 3:
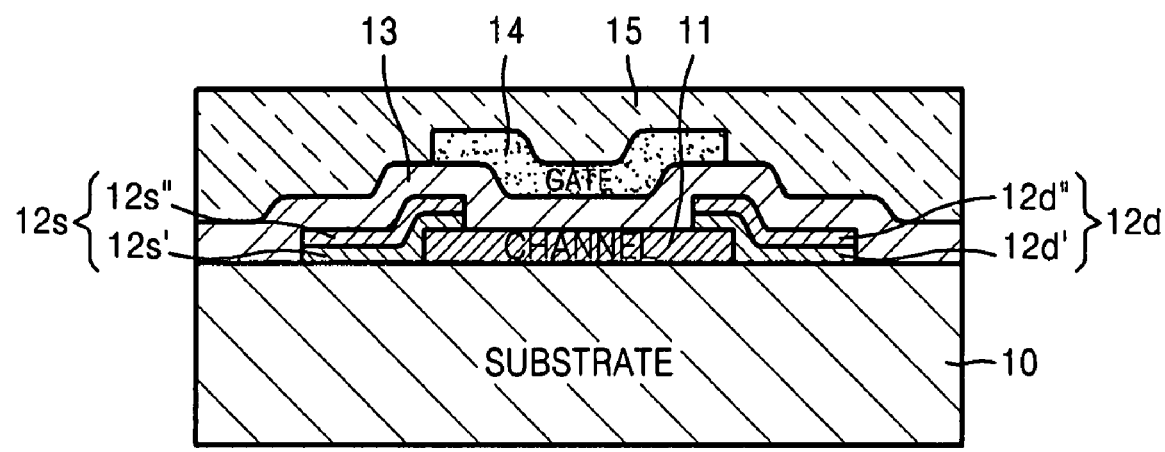
Figure 4:
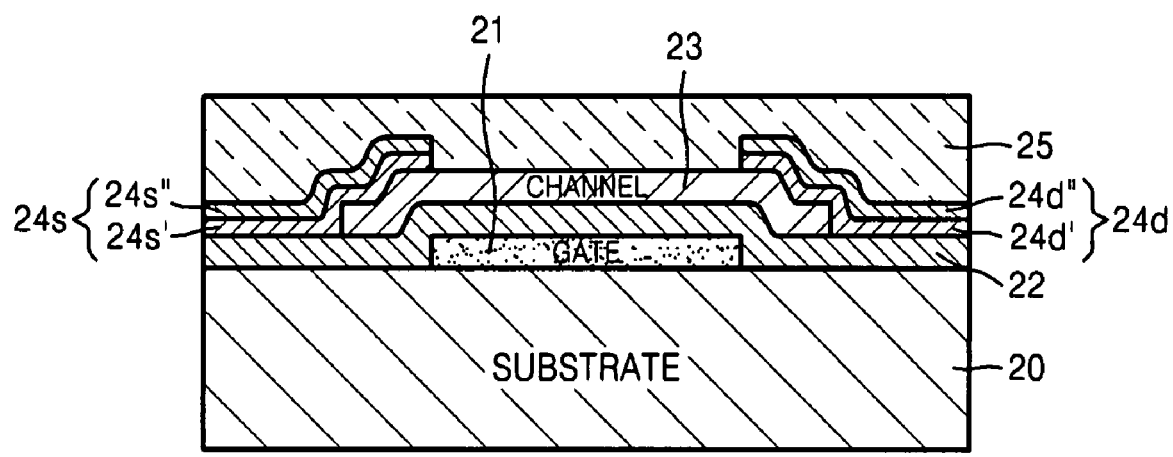

The structure of a ZnO TFT according to example embodiments will now be described. FIG. 3 is a diagram of a top gate type ZnO TFT according to example embodiments, and FIG. 4 is a diagram of a bottom gate type ZnO TFT according to example embodiments. Referring to FIG. 3, a channel 11 may be formed of a ZnO semiconductor material on a substrate 10 formed of a transparent material (e.g., silicon, glass and/or plastic). A source electrode 12s and a drain electrode 12d having multilayered structures may be formed at opposite sides of the channel 11. The source electrode 12s and the drain electrode 12d may overlap with the corresponding ends of the channel 11 by predetermined or given distances.

The source electrode 12s may include first and second layers 12s' and 12s", and the drain electrode 12d may include first and second layers 12d' and 12d". The first layers of 12s' and 12d' of the source and drain electrodes 12s and 12d may be oxygen diffusion layers formed of conductive materials having an affinity for oxygen (e.g., Ti, Ta, Ni and/or ITO). The first layers 12s' and 12d', e.g., the oxygen diffusion layers, of the source and drain electrodes 12s and 12d, may include oxide of the conductive material obtained during thermal diffusion for fabricating a ZnO semiconductor channel and may maintain higher conductivity.

A gate insulator 13, formed of $SiO_2$ and/or SiNx, may be formed to a thickness of about 200 nm on the channel 11 and the source and drain electrodes 12s and 12d. A gate 14 having a thickness of about 200 nm and formed of a conductive material (e.g., Mo) may be formed on the gate insulator 13 so as to face a central portion of the channel 11. A passivation layer 15, formed of $SiO_2$ and/or SiNx, may be formed on the gate 14 to cover the gate 14 and the gate insulator 13. A passivation layer 15 may be formed of $SiO_2$ and/or SiNx on the gate 14 to cover the gate 14 and the gate insulator 13.

Referring to FIG. 4, in the bottom gate type ZnO TFT, a gate 21, formed of Mo, may be formed to a thickness of about 200 nm on a substrate 20, and a gate insulator 22, formed of an insulating material (e.g., $SiO_2$ and/or SiNx), may be formed to a thickness of about 200 nm on the gate 21. A channel 23, formed of a ZnO semiconductor material not including dopant, may be formed on the gate insulator 22 so as to face the gate 21. Both ends of the channel 23 may extend so as not to overlap with the gate 21. A source electrode 24s and a drain electrode 24d may be formed to a thickness of about 100 nm on portions of the gate insulator 22 at opposite sides of the channel 23. The source and drain electrodes 24s and 24d may overlap with corresponding ends of the channel 23 by predetermined or given distances. The source electrode 24s may include first and second layers 24s' and 24s" and the drain electrode 24d may include first and second layers 24d' and 24d". The first layers 24s' and 24d' of the source and drain electrodes 24s and 24d may be diffusion layers formed of a material having an affinity for oxygen (e.g., Ti, Ta, Ni and/or ITO). The first layers 24s' and 24d', e.g., the diffusion layers, of the source and drain electrodes 24s and 24d may include oxide of the conductive material obtained during thermal diffusion for fabricating a ZnO semiconductor channel and may maintain higher conductivity.

A passivation layer 25, formed of $SiO_2$ and/or SiNx, may be formed on the channel 23 and the source and drain electrodes 24s and 24d. The substrates 10 and 20 may be formed of opaque and/or transparent materials depending on which products ZnO TFTs according to example embodiments are applied. For example, if a ZnO TFT according to example embodiments is to be applied to an organic light emitting display using a bottom emitting method, a substrate thereof may be formed of a transparent material.

Figure 5A:
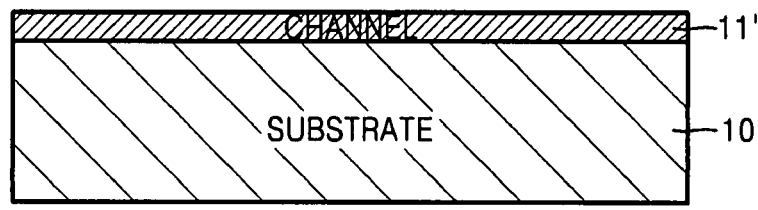
FIGS. 5A-5G are diagrams illustrating a method of fabricating the top gate type ZnO TFT shown in FIG. 3 according to example embodiments.

A method of fabricating a ZnO TFT according to example embodiments will now be described in detail. FIGS. 5A-5G are diagrams illustrating a method of fabricating the top gate type ZnO TFT shown in FIG. 3 according to example embodiments. Referring to FIG. 5A, to form a semiconductor channel, a ZnO layer 11' may be formed to a thickness of about 700 Å on the substrate 10 formed of a transparent or opaque material using an RF magnetron sputtering method. A ZnO target may not include dopant, and the RF magnetron sputtering method may be performed in an atmosphere of a mixture of Ar and oxygen.

Figure 5B:
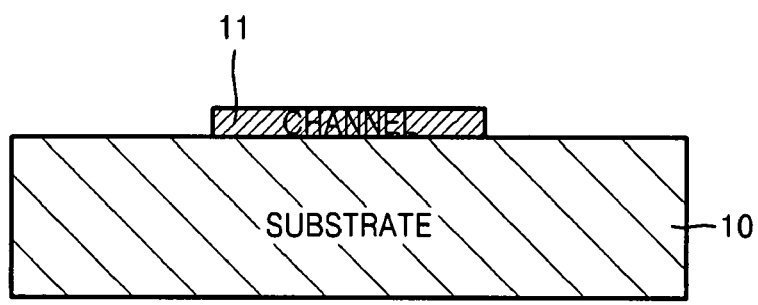
Figure 5C:
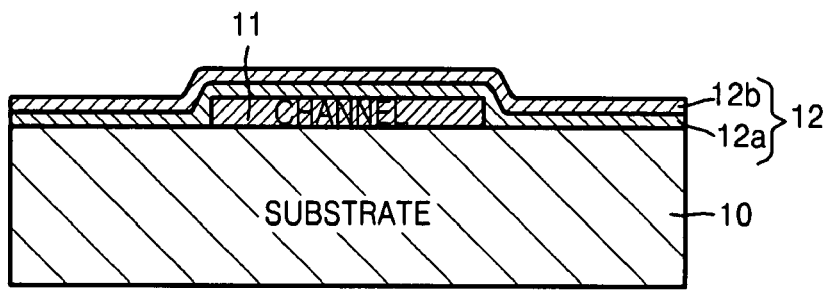
Figure 5D:
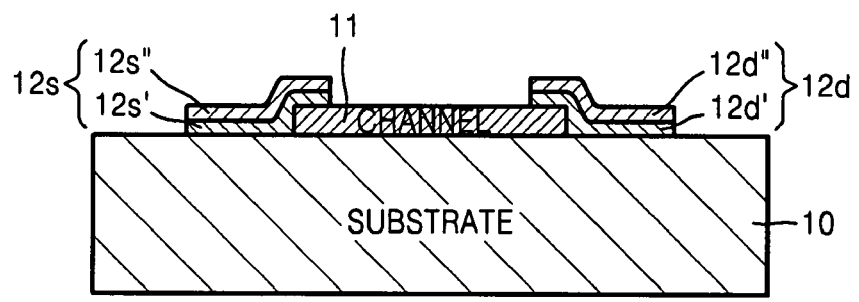

Referring to FIG. 5B, the ZnO layer 11' may be patterned using a photolithographic method to obtain the ZnO channel 11. Referring to FIG. 5C, a source and/or drain layer 12 may be formed on the resultant structure of FIG. 5B. The source and/or drain layer 12 may include first and second layers 12a and 12b, and the first layer 12a may be formed of a material having an affinity for oxygen (e.g., Ti, Ni, Ta and/or ITO). The second layer 12b may be formed of an improved conductor, for example, Pt. Referring to FIG. 5D, the source and/or drain layer 12 may be patterned to form the source electrode 12s and the drain electrode 12d contacting opposite sides of the ZnO channel 11. The source electrode 12s and the drain electrode 12d may respectively include the first layers 12s' and 12d' formed of a material having an affinity for oxygen (e.g., Ti, Ni, Ta and/or ITO) and the second layers 12s" and 12d" formed of Pt.

Figure 5E:
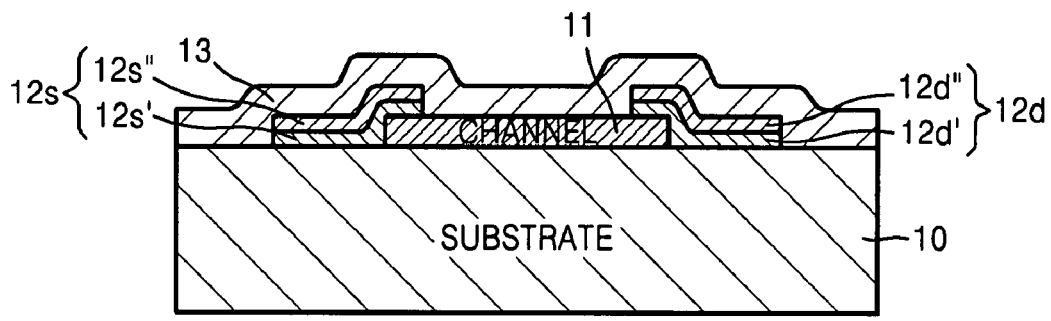
Figure 5F:
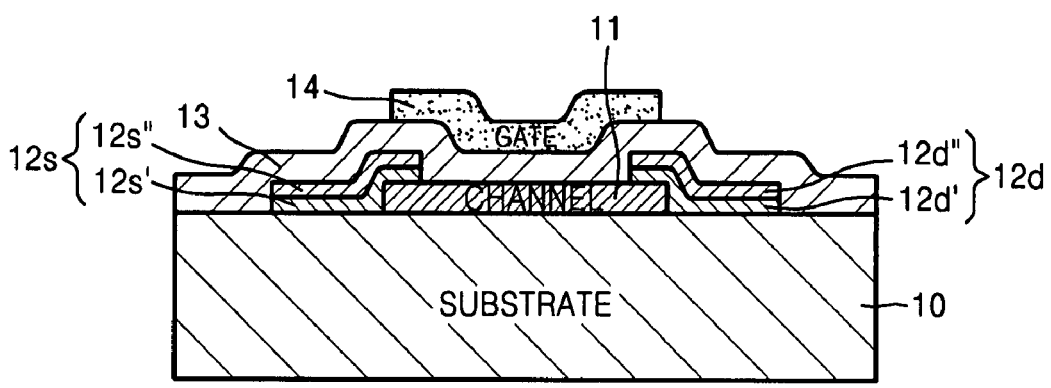

Referring to FIG. 5E, $SiO_2$ and/or SiNx may be deposited to a thickness of about 200 nm by plasma enhanced chemical vapor deposition (PECVD) to form a gate insulator 13 on a stack of the channel 11, the source and drain electrodes 12s and 12d, and the substrate 10 so as to cover the source and drain electrodes 12s and 12d. Referring to FIG. 5F, Mo may be deposited and patterned to form the gate 14 having a thickness of about 200 nm in a position facing a central portion of the channel 11.

Figure 5G:
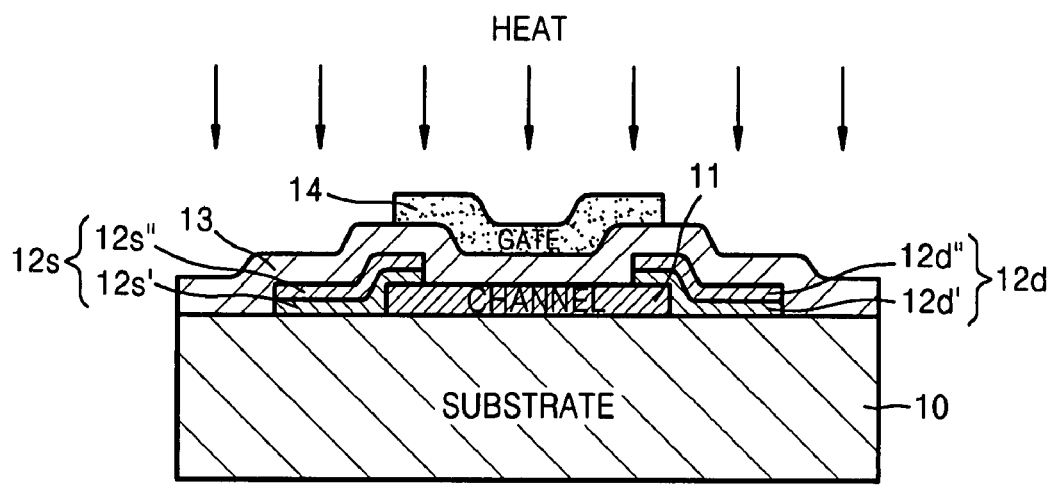

Referring to FIG. 5G, a stacked structure of the channel 11 and the source and drain electrodes 12s and 12d may be heated at a temperature of about 400° C. or less. The heating may be performed in a nitrogen atmosphere using a general furnace, rapid thermal annealing (RTA), laser and/or hot plate. A contact between the channel 11 and the source and drain electrodes 12s and 12d may be stabilized by such heating. In particular, as described in the method of fabricating the ZnO thin film structure, oxygen of the channel 11 may be diffused into the first layers 12s' and 12d' of the source and drain electrodes 12s and 12d, and thus the ZnO channel material may become a semiconductor material. After heat treatment is completed, a passivation layer, formed of $SiO_2$ and/or SiNx, may be formed on the stacked structure to obtain a ZnO TFT formed of a pure ZnO material and having a structure as shown in FIG. 3.

Figure 6A:
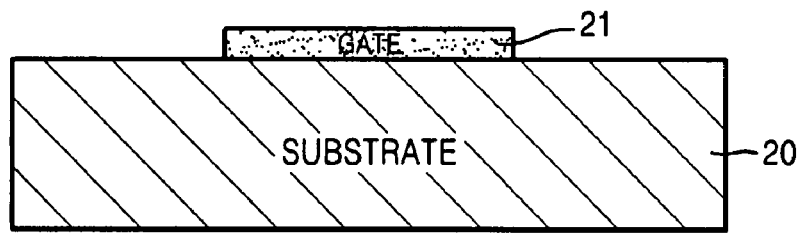
FIGS. 6A-6E are diagrams illustrating a method of fabricating the bottom gate type ZnO TFT shown in FIG. 4 according to example embodiments.
Figure 6B:
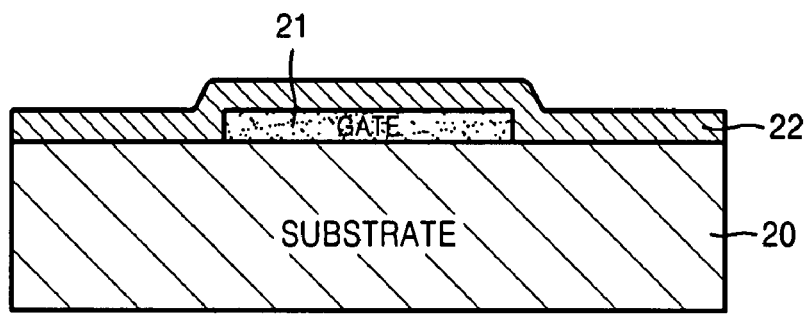
Figure 6C:
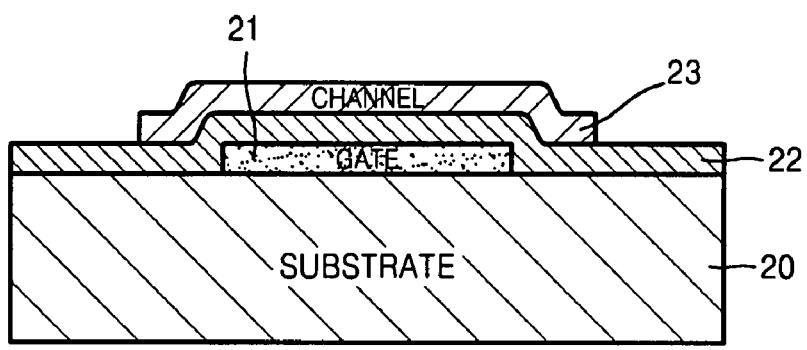

FIGS. 6A-6E are diagrams illustrating a method of fabricating the ZnO TFT shown in FIG. 4 according to example embodiments. Referring to FIG. 6A, Mo may be deposited to a thickness of about 200 nm on the substrate 20 and then patterned to form the gate 21 having a desired shape. Referring to FIG. 6B, the gate insulator 22 may be formed on the resultant structure of FIG. 6A to cover the gate 21. The gate insulator 22 may be formed by CVD and/or PECVD. The gate insulator 22 may be formed of $SiO_2$ and/or SiNx and having a thickness of about 200 nm. Referring to FIG. 6C, a ZnO layer may be formed to a thickness of about 70 nm using the above-described method to obtain the ZnO channel 23 using a general photolithographic method.

Figure 6D:
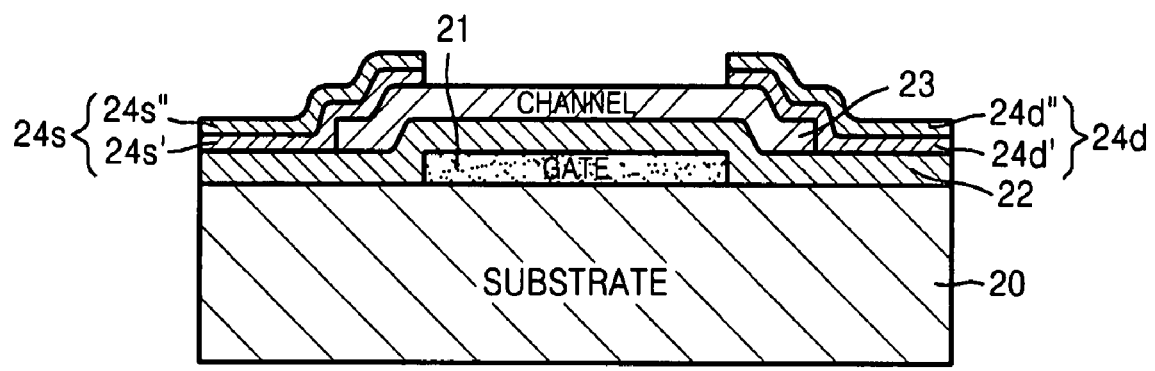

Referring to FIG. 6D, the source and/or drain layer may be formed on the whole surface of the resultant structure of FIG. 6C and patterned to obtain the source and drain electrodes 23s and 24d positioned overlapping opposite sides of the ZnO channel 23. As described above, the source and drain electrodes 23s and 23d may respectively include the first layers 23s' and 23d' as the oxygen diffusion layers and the second layers 23s" and 23d". The first layers 23s' and 23d' may be formed of a material having an affinity for oxygen (e.g., Ti, Ni, Ta and/or ITO). The second layers 23s" and 23d" of the source and drain electrodes 23s and 23d may be formed of an improved conductor, for example, Pt.

Figure 6E:
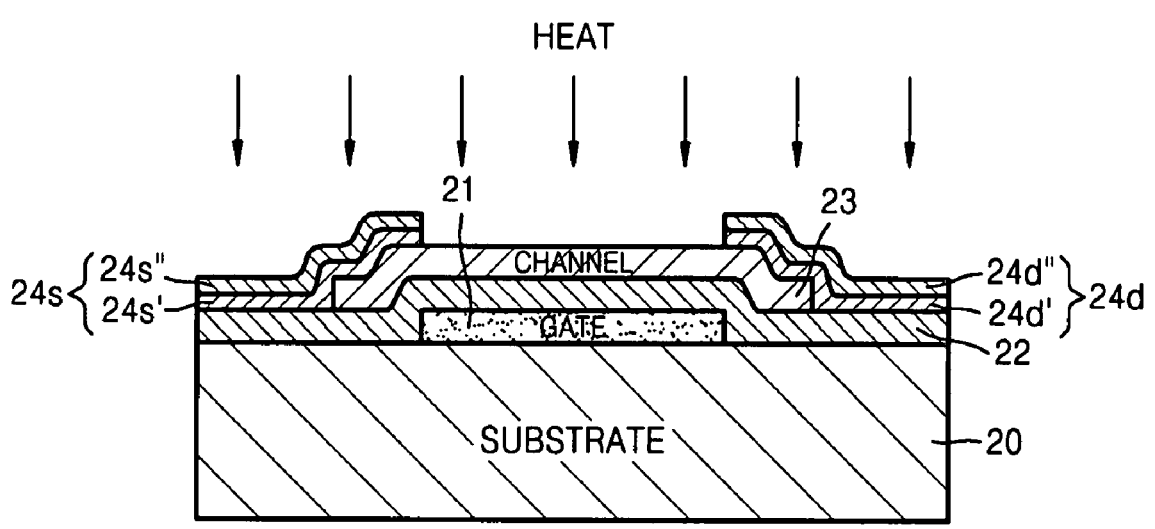

Referring to FIG. 6E, a stacked structure of the ZnO channel 23 and the source and drain electrodes 23s and 23d may be heated to a temperature of about 400° C. or less. The heating may be performed in a nitrogen atmosphere using a general furnace, RTA, laser and/or hot plate. A contact between the ZnO channel 23 and the source and drain electrodes 23s and 23d may be stabilized by such heating. In particular, as described in the method of fabricating the ZnO thin film structure, oxygen of the ZnO channel 23 may be diffused into the first layers 23s' and 23d' of the source and drain electrodes 23s and 23d and thus the ZnO channel material may become a semiconductor material. After heat treatment is completed, a passivation layer may be formed of $SiO_2$ and/or SiNx on the stack structure to obtain an amorphous ZnO TFT having a structure as shown in FIG. 4.

Figure 7:
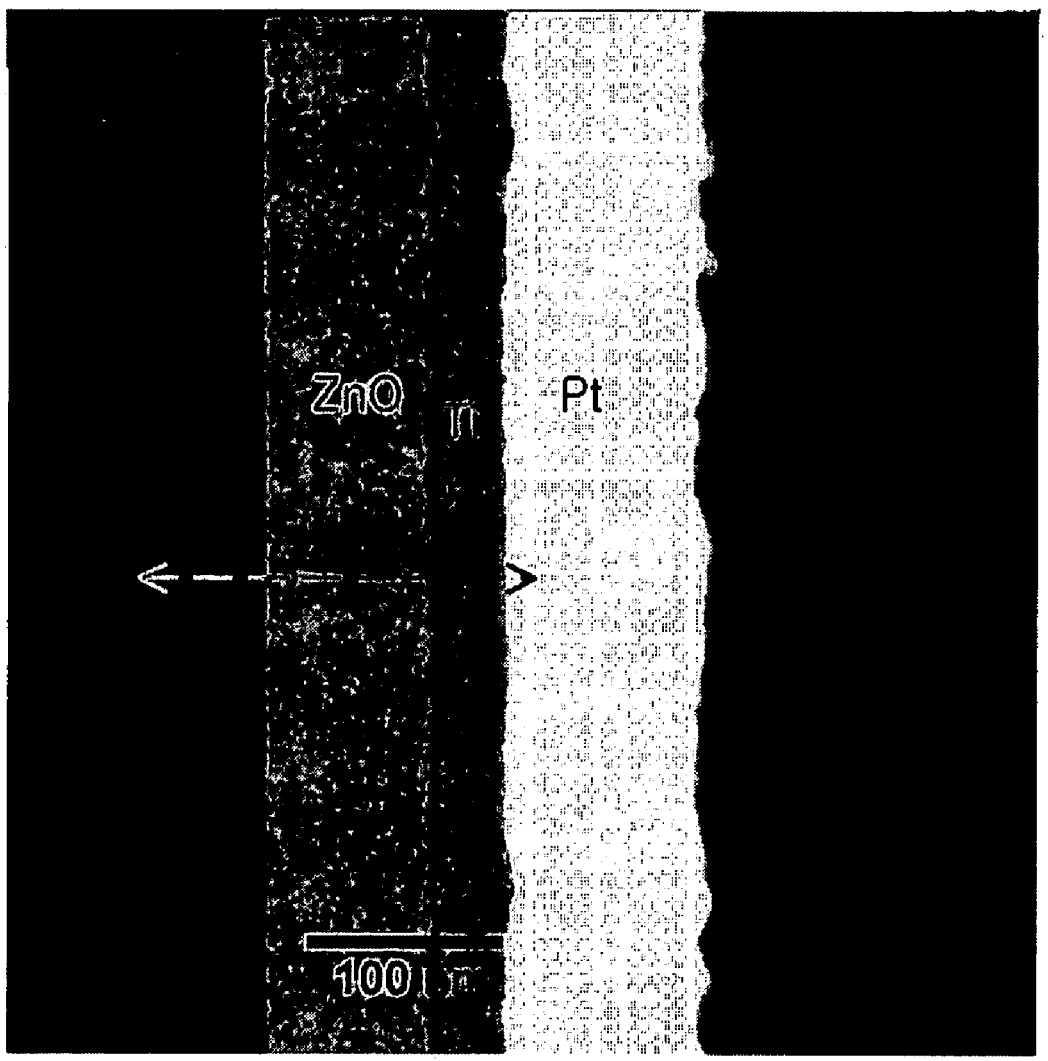

FIG. 7 is a transmission electron microscopy (TEM) image of a sample including a Ti diffusion layer and a Pt electrode formed on a ZnO thin film. Referring to FIG. 7, Ti and Pt layers may be formed on ZnO thin film. An arrow of FIG. 7 on the ZnO thin film and the Ti and Pt layers indicates an area in which an EDX analysis was performed.

Figure 8A:
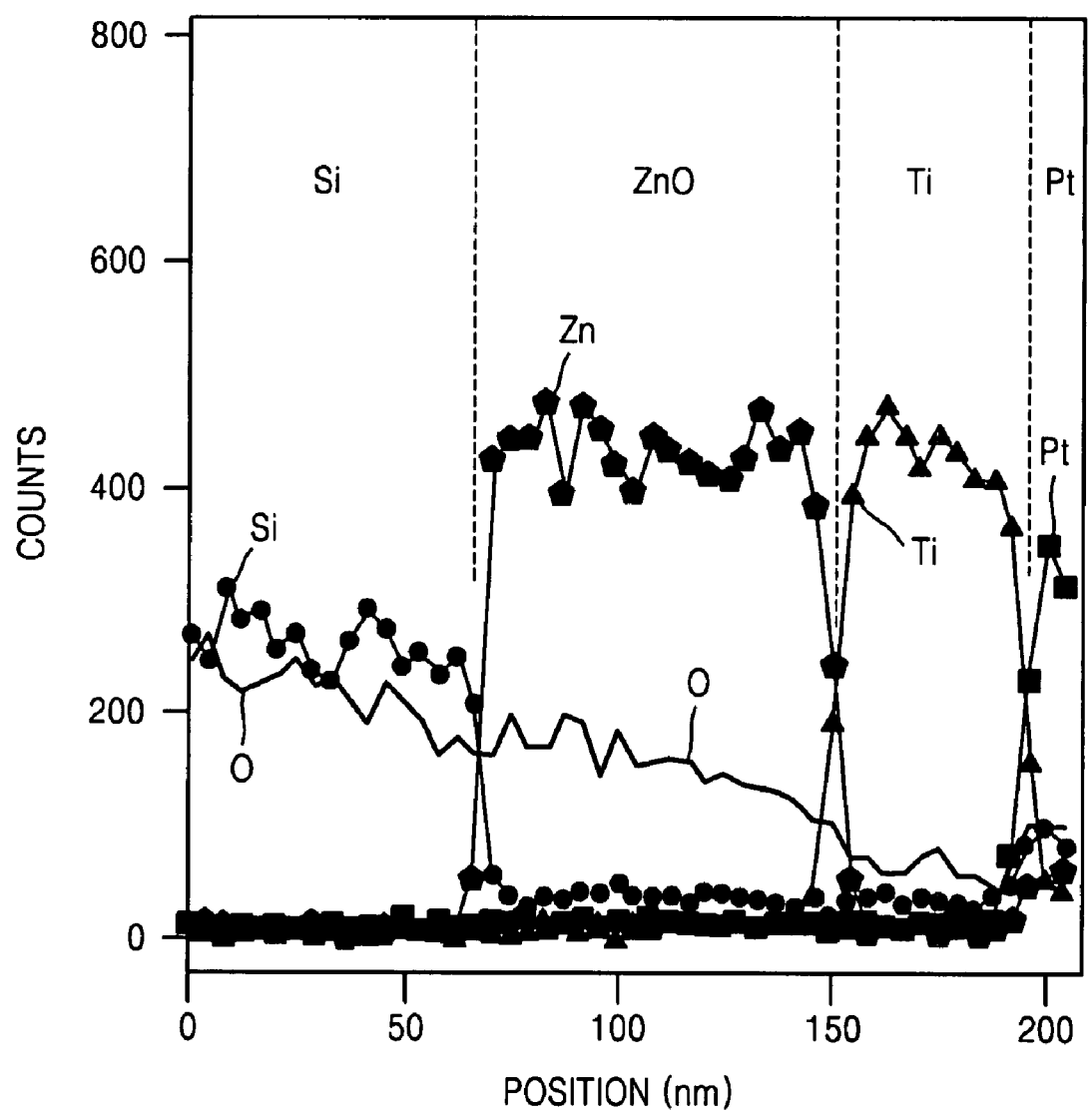
FIGS. 8A and 8B are graphs illustrating the results of an energy dispersive X-ray (EDX) analysis of the sample of FIG. 7 before and after a ZnO thin film was heated.
Figure 8B:
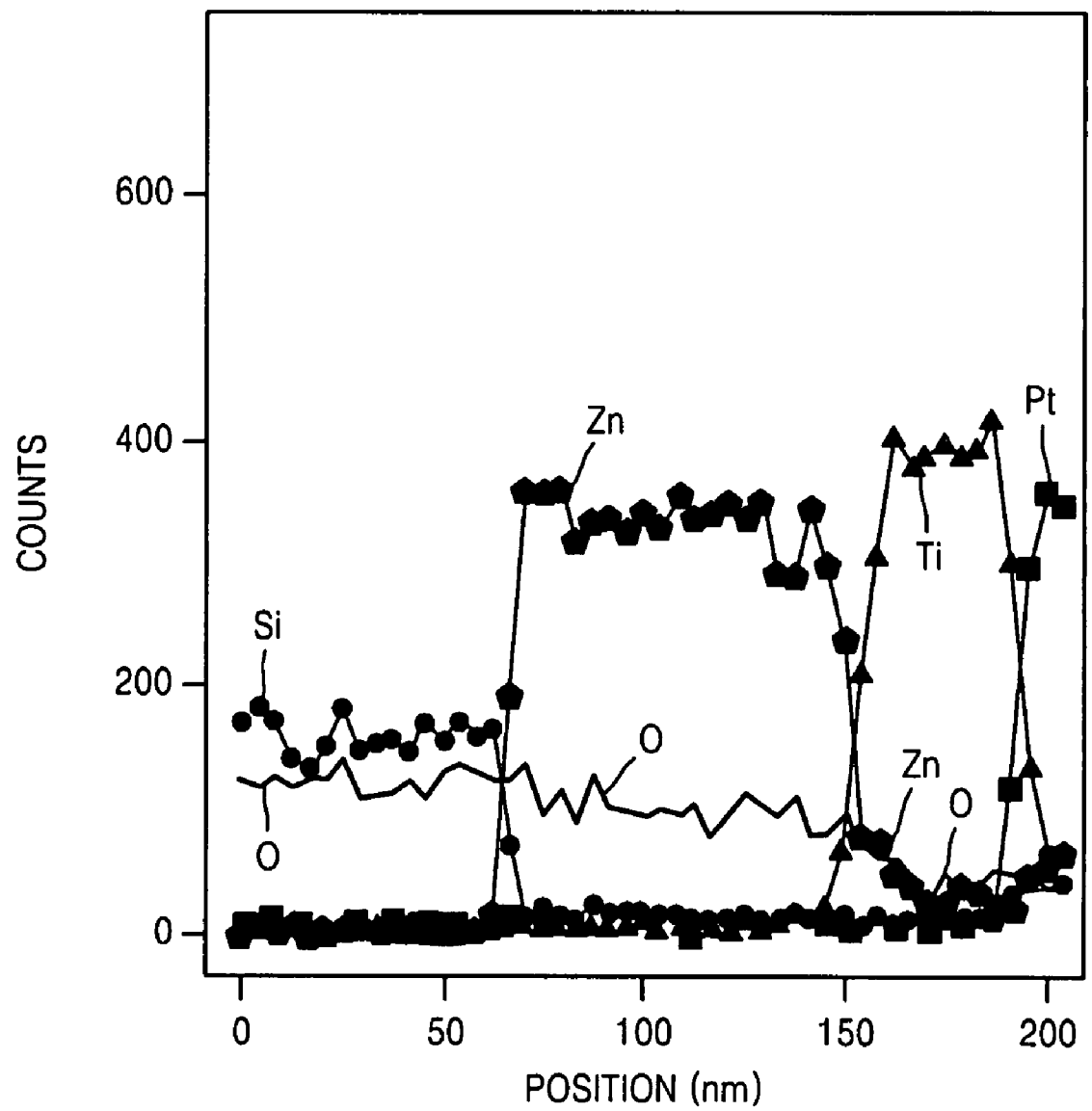

FIGS. 8A and 8B are graphs illustrating the results of an energy dispersive X-ray (EDX) analysis of the sample of FIG. 7 before and after the sample was heated. For heating, RTA was performed for about 1 minute at a temperature of about 350° C. and then performed on a hot plate for about 1 hour at a temperature of about 300° C. Referring to FIG. 8A, a material corresponding to each stack may be distributed. Referring to FIG. 8B, a considerable amount of oxygen in the ZnO layer may be diffused into the Ti layer. Oxygen and Zn may be observed in the Ti layer, and thus it may be seen that Zn diffused into the Ti layer.

Figure 9A:
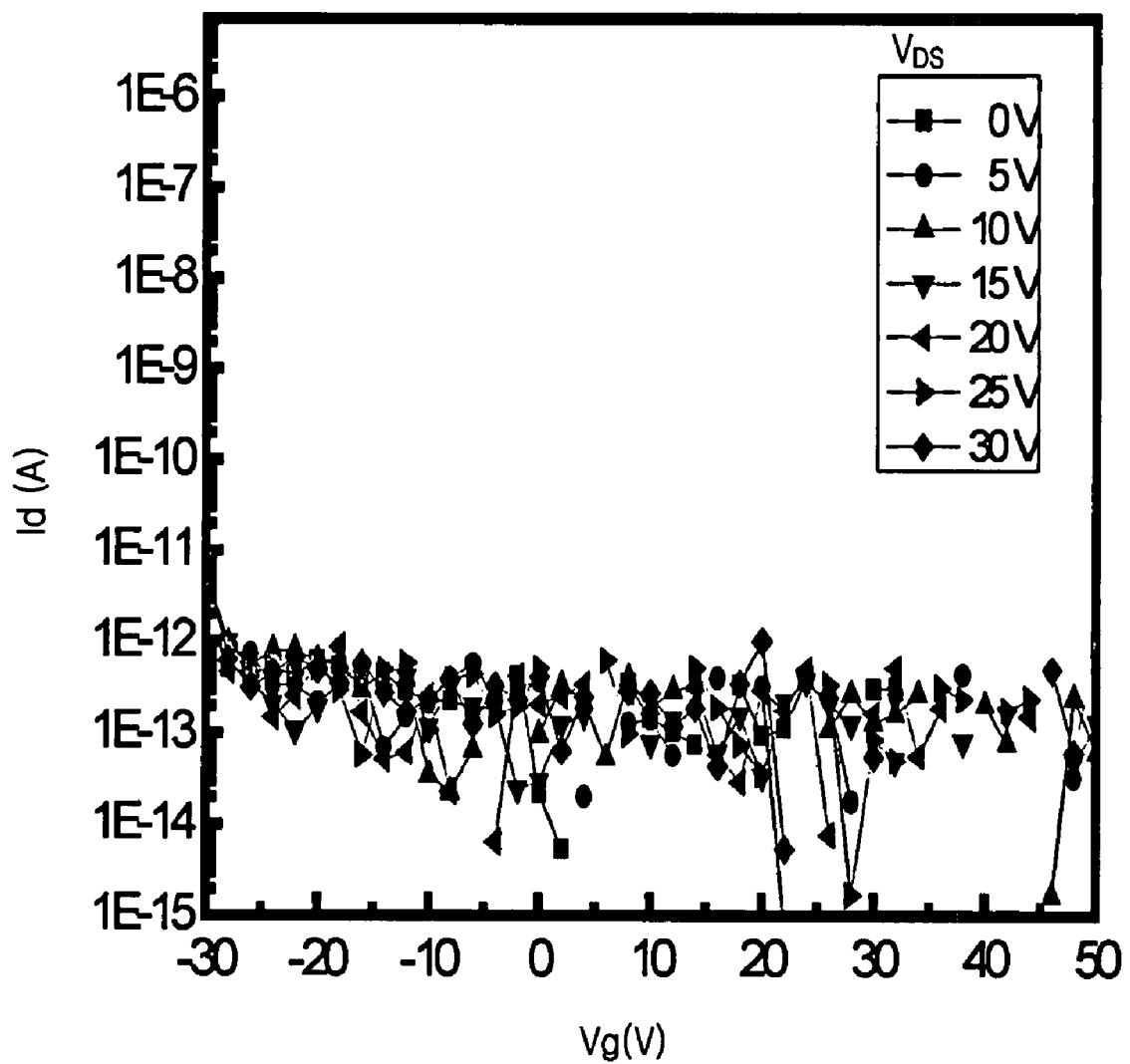
Figure 9B:
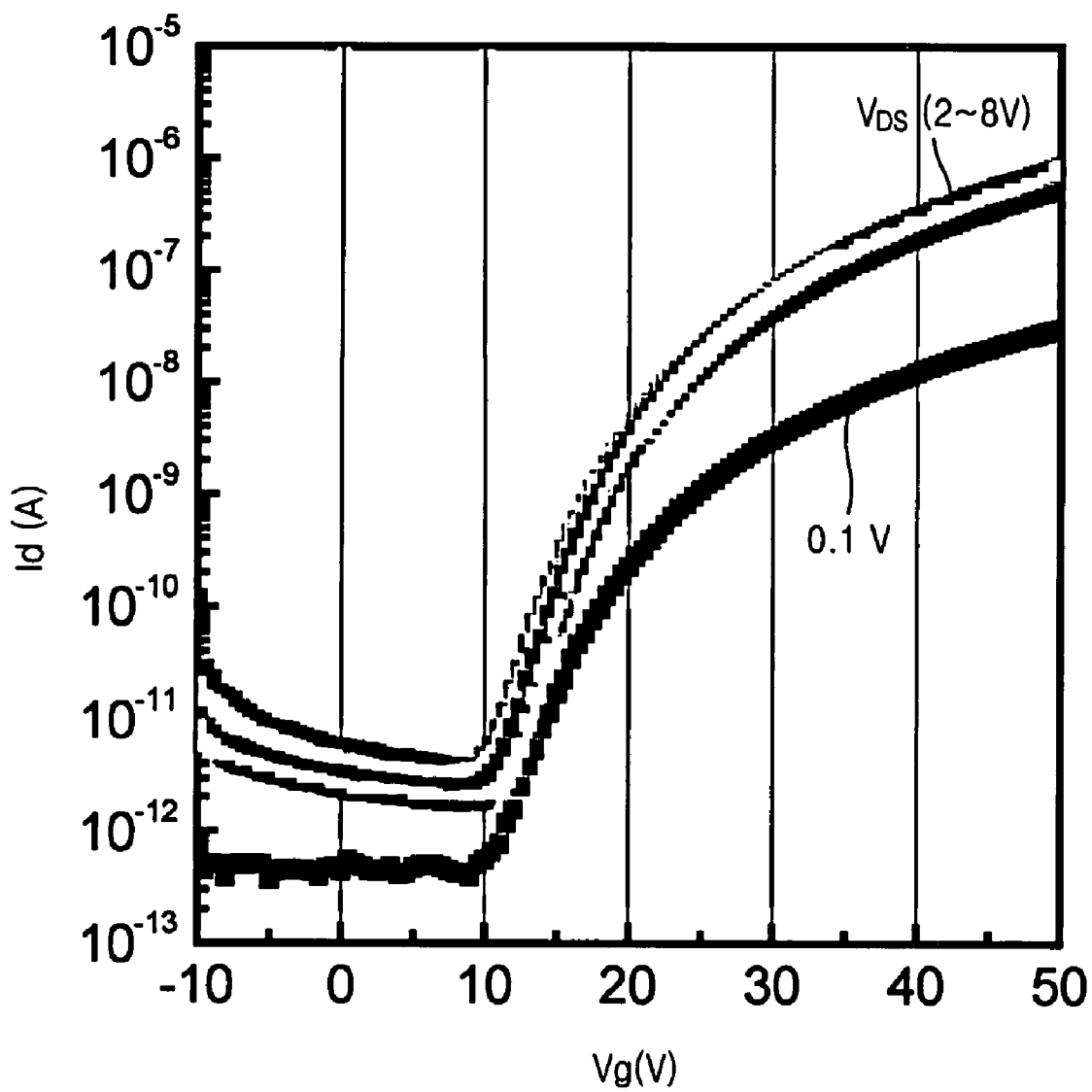
Figure 9C:
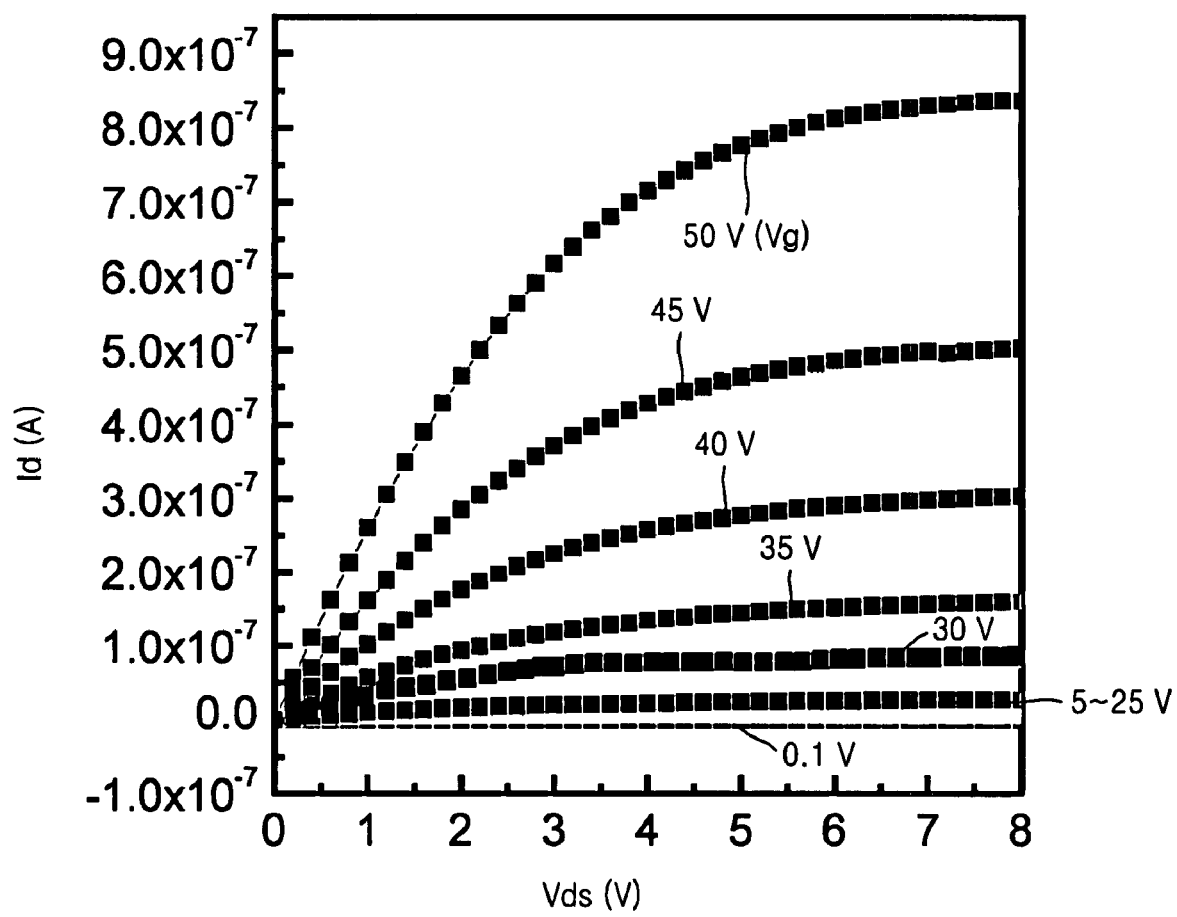

FIGS. 9A-9C are graphs illustrating the electrical properties of a ZnO TFT before and after thermal diffusion. FIGS. 9A and 9B show gate voltage Vg against drain current Id of a ZnO TFT with respect to a series of source-drain voltages about 0V, about 5V, about 10V, about 15V, about 20V, about 25V and about 30V. The fabrication process of the ZnO TFT according to example embodiments used in the experiments of FIGS. 9A and 9B will now be described.

The ZnO may be deposited at room temperature using an RF magnetron sputtering method with a pure ZnO target. An n+ doped Si substrate on which a $SiO_2$ thin film may be formed to a thickness of about 1000 Å may be used. A ratio (vol %) of Ar to $O_2$ may be about 6:1, an RF power may be about 200 W, and a thickness of the ZnO thin film may be about 1000 Å. Source and drain electrodes may be formed of Pt to a thickness of about 1000 Å in a dual layer structure and thus may include diffusion layers formed of Ti and having a thickness of about 10 Å. A width and a length of a ZnO channel of the ZnO TFT may be about 50 μm and about 2.2 μm, respectively. For heating, RTA may be performed at a temperature of about 350° C. for about 1 minute and then performed on a hot plate having a temperature of about 300° C. for about 1 hour.

As shown in FIG. 9A, although a source-drain voltage Vds and a gate voltage Vg vary, a TFT that may not have been heat treated does not operate as a transistor as it may have no variation of a drain current Id. This is because a ZnO thin film may operate as an insulator as shown from the lack of variation in the drain current Id. However, as shown in FIG. 9B, a TFT appropriately heated using RTA and/or a hot plate may operate as a transistor. The drain current Id may be similar when a source-drain voltage Vds between about 2V and about 8V is applied and may be about $10^{-6}$ A at a gate voltage Vg of about 50V. The density of oxygen of the ZnO channel may be reduced due to the diffusion of oxygen of the ZnO channel into first layers, e.g., diffusion layers, of the source and drain electrodes by heating, e.g., thermal diffusion. FIG. 9C is a graph illustrating variations in a source-drain voltage Vds and a drain current Id with respect to a gate voltage about 0.1V to about 50V of a heated ZnO TFT according to example embodiments. As shown in FIG. 9C, the drain current Id may increase with an increase in the gate voltage Vg. The drain current Id may linearly increase with an increase in the source-drain voltage Vds about 0V to about 3V.

Aluminum, if used as a material to form the diffusion layers and familiar with oxygen, may be completely oxidized during heating and thus may become an insulator. Aluminum may not be used as a material for the first layers of the source and drain electrodes. The diffusion layers may be combined with oxygen diffused from the ZnO channel to oxidize a portion of the combination so that the diffusion layers may be kept as electrical paths.

In example embodiments, a ZnO thin film including oxygen within an appropriate amount may be formed, and then the density of oxygen of ZnO may be adjusted using diffusion layers having an affinity for oxygen. Initial ZnO may be required to be formed as ZnO having the density of oxygen around a target through an appropriate adjustment of an oxygen partial pressure. The density of oxygen may be adjusted using oxygen diffusion layers and an appropriate selection of heating conditions. Data for adjusting the density of oxygen may be more easily obtained by repeated experiments and may not limit the scope of example embodiments. Oxygen diffusion layers may be separately formed and may have single and/or dual layer structures. Other layers for efficiently controlling the diffusion of oxygen may be additionally formed. If a ZnO thin film is used as a channel of a TFT, diffusion layers adjusting the density of oxygen of the ZnO thin film may be elements of source and drain electrodes as described above.

As described above, according to example embodiments, the density of oxygen in a ZnO thin film structure sensitive to an oxygen partial pressure may be adjusted to form the ZnO thin film structure. Process margins for fabricating the ZnO thin film structure and a ZnO TFT adopting the ZnO thin film structure may be extended. A ZnO thin film structure that does not depend on dopant and a ZnO TFT adopting the ZnO thin film structure may be fabricated. Example embodiments may be applied to all types of devices using ZnO TFTs, for example, displays including TFTs formed on flexible substrates or organic light emitting diode (OLED) displays.

While example embodiments have been particularly shown and described with reference to exemplary embodiments thereof, it will be understood by those of ordinary skill in the art that various changes in form and details may be made therein without departing from the spirit and scope of the following claims.

What is claimed is:

1. A method of fabricating a zinc oxide (ZnO) thin film transistor (TFT) comprising:
    forming a semiconductor channel including a ZnO thin film in an oxygen atmosphere;
    forming conductive oxygen diffusion layers contacting opposite sides of the semiconductor channel, the conductive oxygen diffusion layers including indium tin oxide (ITO);
    forming source and drain electrodes over the conductive oxygen diffusion layers; and
    heating the semiconductor channel, the conductive oxygen diffusion layers and the source and drain electrodes such that oxygen of the semiconductor channel diffuses into the conductive oxygen diffusion layers and a density of oxygen of the semiconductor channel is adjusted,
    wherein the diffusion of oxygen into the conductive oxygen diffusion layers is controlled by adjusting at least one of temperature and duration of heating, and
    the semiconductor channel, the conductive oxygen diffusion layers and the source and drain electrodes are heated together at a temperature of less than about 350° C. and greater than about room temperature.

2. The method of claim 1, wherein the conductive oxygen diffusion layers are formed after the ZnO thin film is formed.

3. The method of claim 1, wherein the ZnO thin film is formed using a radio frequency (RF) magnetron sputtering method.

4. A method of fabricating a zinc oxide (ZnO) thin film transistor (TFT) comprising:
    forming a semiconductor channel including a ZnO thin film in an oxygen atmosphere;
    forming conductive oxygen diffusion layers contacting opposite sides of the semiconductor channel, the conductive oxygen diffusion layers including indium tin oxide (ITO);
    forming source and drain electrodes directly over the conductive oxygen diffusion layers; and
    heating the semiconductor channel, the conductive oxygen diffusion layers and the source and drain electrodes such that oxygen of the semiconductor channel diffuses into the conductive oxygen diffusion layers and a density of oxygen of the semiconductor channel is adjusted,
    wherein the diffusion of oxygen into the conductive oxygen diffusion layers is controlled by adjusting at least one of temperature and duration of heating, and
    the semiconductor channel, the conductive oxygen diffusion layers and the source and drain electrodes are heated together at a temperature of less than about 350° C. and greater than about room temperature.

5. A method of fabricating a zinc oxide (ZnO) thin film transistor (TFT) comprising:
    forming a semiconductor channel including a ZnO thin film in an oxygen atmosphere;
    forming conductive oxygen diffusion layers contacting opposite sides of the semiconductor channel, the conductive oxygen diffusion layers including indium tin oxide (ITO);
    forming source and drain electrodes directly over and aligned to the conductive oxygen diffusion layers so as to be conformal layers of the same lateral dimensions as the conductive oxygen diffusion layers; and
    heating the semiconductor channel, the conductive oxygen diffusion layers and the source and drain electrodes such that oxygen of the semiconductor channel diffuses into the conductive oxygen diffusion layers and a density of oxygen of the semiconductor channel is adjusted,
    wherein the diffusion of oxygen into the conductive oxygen diffusion layers is controlled by adjusting at least one of temperature and duration of heating, and
    the semiconductor channel, the conductive oxygen diffusion layers and the source and drain electrodes are heated together at a temperature of less than about 350° C. and greater than about room temperature.

6. The method of claim 5, wherein the conductive oxygen diffusion layers are formed after the ZnO thin film is formed.

7. The method of claim 5, wherein the ZnO thin film is formed using a radio frequency (RF) magnetron sputtering method.

* * * * *